United States Patent [19]

Schwirtlich et al.

[11] Patent Number: 4,561,930
[45] Date of Patent: Dec. 31, 1985

[54] PROCESS FOR THE PRODUCTION OF COARSELY CRYSTALLINE SILICON

[75] Inventors: Ingo Schwirtlich; Peter Woditsch; Wolfgang Koch, all of Krefeld, Fed. Rep. of Germany

[73] Assignee: Bayer Aktiengesellschaft, Leverkusen, Fed. Rep. of Germany

[21] Appl. No.: 589,203

[22] Filed: Mar. 13, 1984

[30] Foreign Application Priority Data

Mar. 24, 1983 [DE] Fed. Rep. of Germany ....... 3310827

[51] Int. Cl.⁴ .............................................. C30B 9/04
[52] U.S. Cl. .............................. 156/616 R; 164/122.2
[58] Field of Search ................... 156/616 R, DIG. 64; 164/122.2, 122.1, 123

[56] References Cited

U.S. PATENT DOCUMENTS

| | | | |
|---|---|---|---|
| 2,414,680 | 1/1947 | West et al. ...................... | 156/616 R |
| 3,012,865 | 12/1961 | Pellin ............................... | 156/616 R |
| 3,242,015 | 3/1966 | Harris .............................. | 156/616 R |
| 3,986,837 | 10/1976 | Sugiyama et al. . | |
| 4,256,530 | 3/1981 | Schmid et al. .................. | 156/616 R |
| 4,341,589 | 7/1982 | Grabmaier .................. | 156/DIG. 64 |
| 4,382,838 | 5/1983 | Authier ........................... | 156/616 R |

FOREIGN PATENT DOCUMENTS 3150539 6/1983 Fed. Rep. of Germany .
2500854 9/1982 France .

*Primary Examiner*—Hiram H. Bernstein
*Attorney, Agent, or Firm*—Sprung Horn Kramer & Woods

[57] ABSTRACT

A process for the production of columnarly grown blocks of silicon containing coarsely crystalline regions comprising cooling a silicon melt in a mold, selectively effecting solidification at the melt surface and advancing the solidification front downwardly. The blocks can be sawed into chips, useful for solar cells.

4 Claims, 3 Drawing Figures

PROCESS FOR THE PRODUCTION OF COARSELY CRYSTALLINE SILICON

This invention relates to a process for the production of silicon blocks containing columnar, coarsely crystalline regions by cooling a silicon melt.

The shortage and increasing cost of fossil fuels has resulted in a more intensive search for alternative energy sources. All over the world, possible methods of using solar energy for energy recovery are being sought at considerable expense.

In addition to thermal energy recovery processes, the direct conversion of solar energy into electricity by the photovoltaic effect using suitable semiconductors is a highly promising alternative for meeting the demand for energy in the future.

Even today, solar cells based on silicon are virtually the only source of energy in space satellites. However, the silicon used, which comes from the semiconductor field, is too expensive for terrestrial energy generation, with the result that there has been no shortage of attempts to develop less expensive methods of producing silicon, silicon chips and, from them, solar cells.

A major step in the cost reduction chain is the replacement of complicated single-crystal growth processes (for example the Czochralski process) by a rapid, semicontinuous casting process. The objective here must be to obtain a high level of efficiency of the silicon chips obtained by sawing from silicon blocks of the type in question. According to present knowledge, a high degree of efficiency in the conversion of sunlight into electricity is obtained if, in addition to adequate purity, as few grain boundaries as possible occur in the silicon chip, i.e. if predominantly monocrystalline regions are present. These monocrystalline regions should contain the fewest possible lattice faults, such as dislocations, voids and interlattice atoms.

There has been no shortage of attempts in recent years to provide such a material. Thus, U.S. Pat. No. 4,243,471 describes a method of obtaining crystalline silicon by controlled solidification. In this case, the expansion of approximately 10% of the silicon during its transition from the liquid to the solid state is counteracted by allowing the silicon—after melting in a medium-frequency-heated graphite susceptor—to grow from the bottom by slowly lowering the container. The use of a chill mold having a coefficient of expansion of 3.0 to 4.3 $10^{-6}$° $C.^{-1}$ at temperatures in the range from 20 to 650° C. is intended to ensure that silicon which has been subjected to controlled solidification is not exposed at temperatures in that range to any thermal stressing emanating from adhesion of the silicon to the walls of the vessel or from the higher expansion coefficient by comparison with the silicon.

However, this process has the serious disadvantage that it is very difficult to form a uniform solidification front. Continued heating with the medium frequency coil produces considerable turbulence which can also adversely affect the crystallization front and cause lattice disturbances.

In this case, the initial crystallization phase, which is particularly critical in all processes, begins at the bottom of the container and, on account of the seed-forming effect which the surface roughness has, leads to a plurality of crystallites which grow in competition with one another, so that only relatively small monocrystalline regions are able to develop.

According to DE-A No. 3 138 227, silicon is melted in a quartz vessel and kept at a temperature just above its melting point. In this case, the seed crystal is a monocrystalline silicon seed which is arranged from the outset on the bottom of the melting vessel and which is kept by gas cooling at a temperature which prevents melting. The effect of this is that crystallization takes place from the bottom over a period of several hours with cooling of the silicon. It is possible by this process to obtain predominantly monocrystalline regions, in addition to which the silicon melt is additionally purified by virtue of the different solubilities of most of the impurities in liquid and solid silicon. The disadvantage of this so-called heat exchanger process lies in the slow solidification of the melt because the heat of fusion, which is very intense in the case of silicon, has to be completely dissipated through the gas-cooled silicon monocrystal plate and the low thermal capacity of the cooling gas. Even in the case of relatively small blocks, this leads to long crystallization times of several hours. Si-blocks measuring 20×20×10 cm$^3$ require crystallization times of several days. Another disadvantage of this process is that it cannot be carried out semicontinuously by separating the melting crucible and solidification vessel from one another and therefore rapidly melting the silicon in a crucible and subsequently pouring it off into several solidification molds is not possible.

The purifying effect by which the slow crystallization process is accompanied due to the segregation coefficients for impurities in silicon is common to all processes in which the crystallization rate is controlled and adjustable under control.

Greater throughputs in a semicontinuous process are obtained in accordance with DE No. 2 745 247. In this known process, silicon moldings having a columnar structure are obtained by pouring a silicon melt into a mold and allowing the melt to solidify, the contact surface of the mold with one of the two largest, opposite boundary surfaces of the melt being kept at a temperature of at most 1200° C. and the opposite boundary surface of the melt being exposed to a temperature 200° to 1000° C. higher, but below the solidification point of silicon. The casting mold is then cooled, the heat of fusion of the silicon being dissipated by intensive cooling of the base of the mold. The silicon obtained is a polycrystalline silicon in which controlled solidification is induced, In this case, too, seed formation takes place on the bottom of the casting mold and, hence, on a foreign surface with all the disadvantages which this involves.

All the controlled solidification processes described thus far are attended by the disadavantage that heterogenous seed formation on the walls of the mold, but especially on its base, always produces a number of crystallites which, although leading to columnar silicon, produce grain diameters of a few millimeters only through the competing growth processes in molds measuring 10×10 cm$^2$.

Although the heat exchange process gives a more coarsely crystalline material with predominantly monocrystalline regions, it is laborious, expensive and hence uneconomical.

Accordingly, the object of the present invention is to provide a process which does not have any of the disadvantages attending the processes described above.

It has now surprisingly been found that considerably coarser crystals with a preferred direction can be obtained, even at high crystallization rates, providing seed formation begins at the surface of the melt and crystallization takes place from the surface of the melt to the bottom of the mold.

Accordingly, the present invention relates to a process for the production of silicon blocks containing coarsely crystalline regions of columnar structure by cooling a silicon melt, characterized in that solidification is allowed to begin at the surface of the melt.

The moldings solidified by the process according to the invention have a columnar structure, predominantly contain large, monocrystalline regions and predominantly show a crystallographic preferred orientation.

This favorable behavior, is observed both in the case of self-seeding and also in the case of surface inoculation with one or more monocrystals and remains the same over the entire crystallization zone. A striking feature is the development during solidification from the surface of relatively large crystal structures when crystallization is carried out both from the surface of the melt and from the bottom. This promotes crystallization in the direction of gravity both in regard to seed formation and also in regard to further growth.

The number of seeds used or produced at the surface may be controlled and varied. Where the melt is self-seeding, the seed count may be controlled with advantage through the size of the cooled surface area and the intensity of cooling. The cooling rate may be distinctly increased in the course of crystallization, thereby increasing economy.

To control crystal growth, it is of advantage to ensure fine adjustment of the temperature conditions by coordinating cooling of the melt surface with heating of the crystallization vessel.

Seed formation at the surface and the crystallization process as such are controlled by the following parameters: the temperature of the silicon melt before the beginning of crystallization, the size of the cooled surface area, the dissipation of heat after the beginning of crystallization, the size and temperature of the seed crystals.

Basically, the process according to the invention is unaffected by the prevailing pressure conditions. Accordingly, it may be carried out with advantage both in vacuo and under atmospheric pressure. The pressure may be used to control the dissipation of heat from the crystallizing surface. For example, after seed formation in vacuo or under low pressures of a few millibars, the dissipation of heat may be intensified under otherwise the same conditions by building up an increasing pressure with an inert gas.

The crystallization vessel may be heated by any of the known methods currently in use.

The mold material used is not critical to crystallization in the process according to the invention as long as it satisfies the requirements in regard to stability to liquid silicon. For reasons of purity of the silicon crystals, chill molds of graphite, silicon nitrite or silicon carbide may be used without any particular problems. Chill molds which may be coated with silicon nitrite or silicon carbide may be used in particular for large-scale operation in order to guarantee inexpensive production. In using quartz vessels it is desirable to coat the surfaces with silicon nitride. The coating of quartz crucibles with $Si_3N_4$ can further improve their use because, in cases such as these, the crystalline silicon does not cake on the walls of the mold, so that there is no adhesion between the mold and the solidified silicon.

The already existing possibility of obtaining additional purification in the event of slow crystallization by virtue of the different solubilities of impurities in liquid and solid silicon, also exists in the crystallization process according to the invention. Accordingly, it may be used in the same way as the heat exchange process for the crystallization of pre-purified metallurgical silicon.

Particularly effective purification may be obtained if, instead of the entire melt, only a proportion amounting to 30% or 50%, for economic reasons up to 80%, of the liquid silicon is allowed to solidify. In this case, the solidified silicon is separated from the rest of the melt which may then be reused or purified. In certain cases, it may even be advisable to accept an additional machining step of sawing up the solidified silicon block if this means that less elaborately purified silicon may be used as the starting material.

Removal of the 50 to 90% solidified silicon block from the rest of the melt may be carried out by any of various methods and is of no importance to the process according to the invention. From freezing on a bar, for example of silicon, to pouring off the rest of the melt, the possibilities are numerous.

In another embodiment of the process according to the invention, the entire silicon melt is used for crystallization. In this case, provision should be made as far as possible for the equalization of pressure in order fully to utilize the advantages of the process according to the invention. The increase in volume of the silicon can be prevented from interfering with the crystallization front, the already solidified silicon and the mold walls. This may be done, for example, by the provision of an overflow, of a heated zone within the mold or of a prepared point of fracture in the wall of the mold.

Since the process for solidifying a silicon melt is controlled in such a way that the fewest possible disturbances occur at the solidification front and in such a way that the unfavorable effect of gravity may even be distinctly reduced, the crystal regions obtained contain fewer disturbances than those obtained by antigravitational solidification.

Silicon blocks obtained in this way may be sawed by known methods to form silicon chips which may be used with advantage as starting material for the production of solar cells.

The invention is illustrated butin no way limited by the following examples.

EXAMPLE 1

The object of this example is to demonstrate the difference in the size of the crystals grown on the one nand from the wall of the mold and, on the other hand, from the free surface.

To this end, an $Si_3N_4$-coated chill mold having a base area of $100 \times 100$ mm$^2$ was resistance-heated to approximately 1350° C. (1.4 kW). A suitably selected insulation ensured that the dissipation of heat from the upper part of the mold was greater than from the lower part thereof. The loss of heat from the upper part of the mold was compensated by a higher temperature of the resistance heating system in that zone.

Silicon powder was melted in a medium-frequency-heated graphite crucible and poured off into the mold at 1500° C.

Immediately afterwards, the output of the mold heating system was continuously reduced by 170 W/h. Complete solidification of the Si-block was reflected in the accelerated fall in temperature after about 170 minutes.

Figure 1:
FIG. 1 is a photomicrograph showing the interface between the Si-melt solidified downwards from the surface and the Si-melt solidified upwards.

The block cooled to room temperature showed a distinctly coarser crystal structure in the region solidified from the surface of the melt (comprising approximately 40% of the block) by comparison with the region solidified from the base of the mold (FIG. 1).

In this case, the increase in pressure between the solidification fronts brought about by the increase in volume during solidification was eliminated by forcing the rest of the melt upwards along the wall of the mold.

Figure 2A:
FIG. 2 is a photomicrograph showing chips sawed off from the lower part (a) and upper part (b) of the Si-block shown in FIG. 1.
Figure 2B:

The difference in grain size between the region solidified from above and the region solidified from below can clearly be seen from the chips correspondingly sawed off which are shown in FIG. 2.

EXAMPLE 2

In this example, the objective was to obtain rapid cooling rather than oversize grains.

A chill mold comparable with that used in Example 1 was uniformly resistance-heated to 1430° C. The mold was insulated in such a way that heat was mainly dissipated from the upper part thereof. After silicon powder had been inductively melted in a graphite crucible and heated to 1500° C., it was poured off into the heated mold under a pressure of approximately 10-4 mbar. Thereafter, the pressure was increased to 800 mbars over a period of 10 minutes by the introduction of argon. The resistance heating of the mold was then switched off and the system left to itself. After only 3 hours, it was possible to remove the Si-block from the apparatus. It showed a coarsely crystalline structure which had spread from the surface of the melt to the bottom of the mold. The crystal grains had a diameter of approximately 1.0 cm for a length of a few centimeters.

The pressure built up by the increase in volume was dissipated by breaking the base of the mold which had been deliberately made weak to act as a predetermined fracture zone. Remarkably, no liquid silicon flowed out.

EXAMPLE 3

In this Example, crystallization was intitiated at the surface by a 1 $cm^2$ seed immersed in the melt and supported by slowly increasing the gas pressure to 800 mbars. Under test conditions otherwise comparable with those of Example 1, crystal growth over about 50 mm, starting from the seed, was observed. In this experiment, too, pressure was dissipated by breaking the mold at a predetermined point without the molten silicon flowing out.

It will be appreciated that the instant specification and examples are set forth by way of illustration and not limitation, and that various modifications and changes may be made without departing from the spirit and scope of the present invention.

What is claimed is:

1. A process for the production of columnarly grown blocks of silicon containing coarsely crystalline regions comprising cooling a silicon melt in a mold, selectively effecting solidification at the melt surface and advancing the solidification front downwardly.

2. A process as claimed in claim 1, wherein about 30 % to 80 % of the melt is subjected to controlled solidification and crystallization in downward direction.

3. A process as claimed in claim 1, wherein crystallization is initiated from the melt surface by the controlled dissipation of heat.

4. A process as claimed in claim 1, wherein crystallization is initiated at the melt surface by at least one monocrystalline piece of silicon placed on or immersed in the melt.

* * * * *